United States Patent [19]
Rufray et al.

[11] Patent Number: 5,005,073
[45] Date of Patent: Apr. 2, 1991

[54] DEMULTIPLEXER FOR PROVIDING A COLOR TELEVISION SIGNAL HAVING AN INCREASED IMAGE FREQUENCY

[75] Inventors: Jean C. Rufray, Brigachtal; Jean C. Guillon, Erstein, both of Fed. Rep. of Germany

[73] Assignee: Deutsche Thomson-Brandt GmbH, Hanover, Fed. Rep. of Germany

[21] Appl. No.: 252,051

[22] Filed: Sep. 30, 1988

[51] Int. Cl.$^5$ .............................................. H04N 9/64
[52] U.S. Cl. .................................. 358/21 R; 358/137; 370/112
[58] Field of Search .................... 358/21 R, 180, 137, 358/134; 370/84, 112

[56] References Cited
U.S. PATENT DOCUMENTS

| | | | |
|---|---|---|---|
| 4,758,881 | 7/1988 | Laspada | 358/21 R |
| 4,864,402 | 9/1989 | Ebihara | 358/21 R |

*Primary Examiner*—Tommy P. Chin
*Attorney, Agent, or Firm*—Spensley Horn Jubas & Lubitz

[57] ABSTRACT

In order to achieve a qualitative improvement of television images through increased image frequency with simultaneously increased resolution, a high storage capacity is needed. In order to process a combined color television signal, a demultiplexer with a shift register to which the data stream of the color television signal is fed is employed. Parallel outputs from this shift register are connected to a storage. Additionally, a second and third shift register are present whose parallel inputs are connected in the storage and from whose serial outputs the individual components of the color television signal can be obtained. Further, a sequence controller consisting of address counters is used to individually access rows and columns of the second and third shift registers. The invention simplifies the use of storage for digital signal processing in color television sets.

7 Claims, 3 Drawing Sheets

FIG. 1
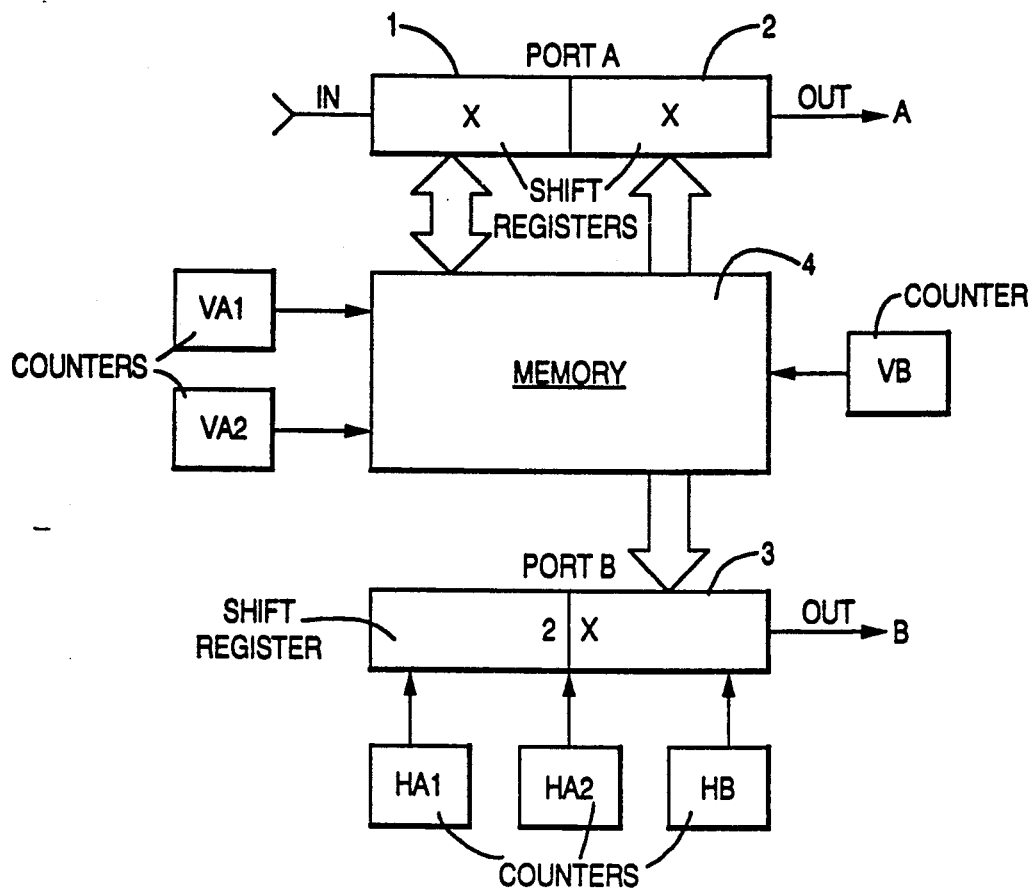
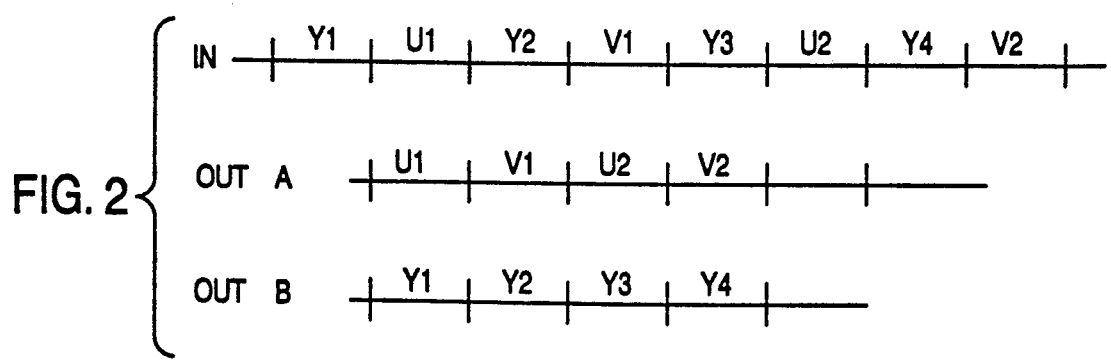
FIG. 2

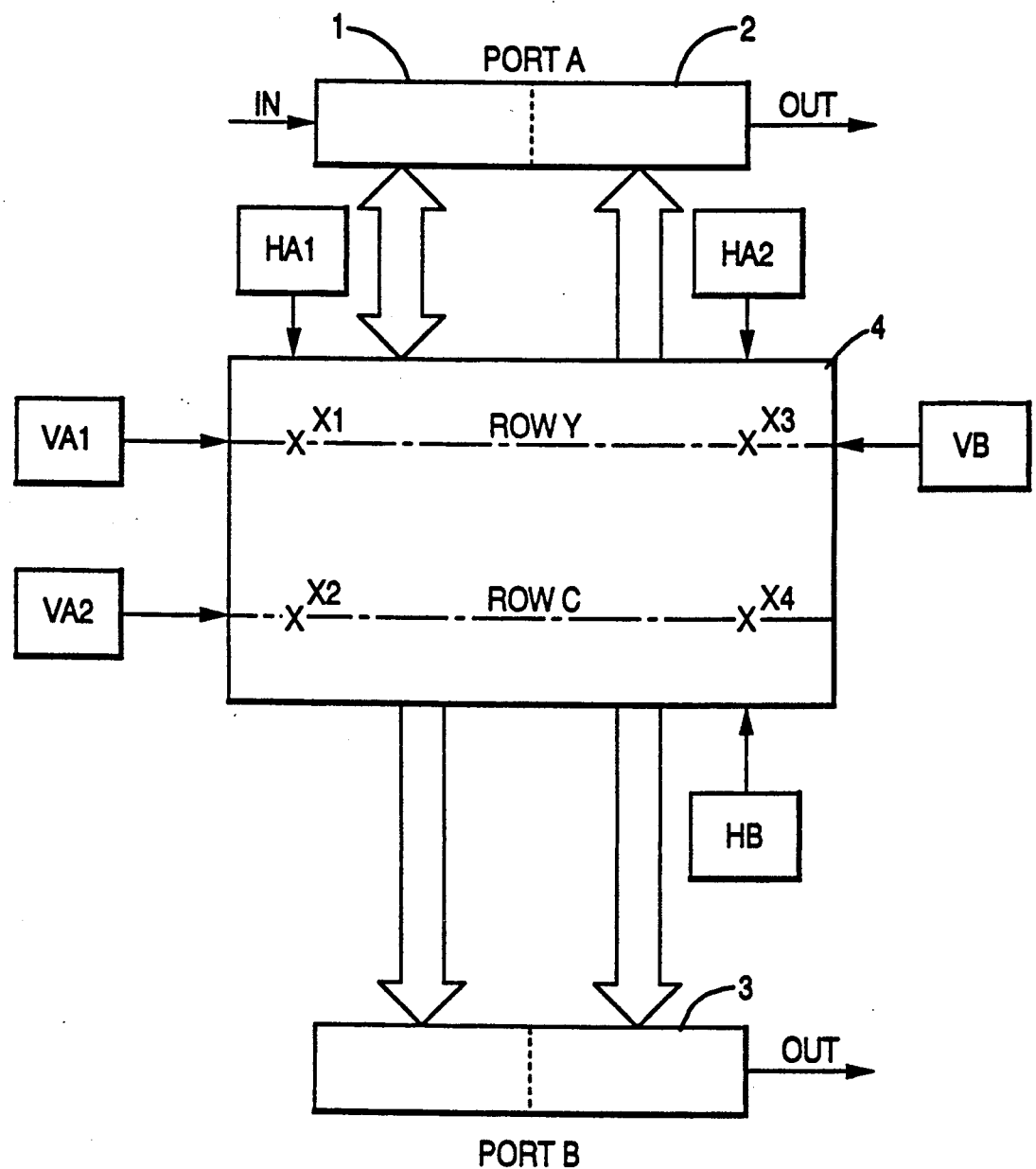

DEMULTIPLEXER FOR PROVIDING A COLOR TELEVISION SIGNAL HAVING AN INCREASED IMAGE FREQUENCY

BACKGROUND OF THE INVENTION

The invention relates to a demultiplexer for a combined color television signal.

It is known that, in order to prevent large scale flickering of television images the image frequency, or frame rate, should be raised to 100 Hz, or 120 Hz, from the present 50 Hz, or 60 Hz, respectively. In order to keep the cost of the storage elements for digitalized image data required to temporarily store the digitalized image data within limits, the scanning rate has been fixed at 10.125 Mhz for luminance components and at 3.375 Mhz for chrominance components with line-jump scanning.

These frequencies are high enough for natural images, but are too low for high resolution images such as computer graphics In the latter case, higher scan frequencies are preferred, in particular; 13.5 MHz for luminance and 6.75 MHz for chrominance, whereby the number of image points is increased in every line. Thus, the total scanning rate is doubled again, at least for the chrominance components, when compared to the flicker-free line-jump scanning.

From the above discussion it follows that the scanning rate for luminance is 13.5 MHz, for the U component of the chrominance it is 6.75 MHz and for the V component of the chrominance it is also 6.75 MHz. The total scanning rate for chrominance is thus also 13.5 MHz.

Presently available image memories are not able to store this quantity of data. In order to nonetheless obtain a higher image frequency, the individual lines would have to be repeated The disadvantage of the required switching arrangement is that a line memory would need to be installed in addition to the image memory.

SUMMARY OF THE INVENTION

It is an object of the present invention to overcome the above-noted disadvantage by the provision of a novel switching arrangement which requires only a single memory for its operation.

The above and other objects are achieved, according to the present invention, by a demultiplexer for a combined color television signal composed of luminance components and chrominance components, comprising:

a first shift register having a plurality of register locations, serial inputs connected to receive the combined television signal, and parallel outputs;

second and third shift registers each having a plurality of register locations, parallel inputs and serial outputs for outputting respective components of the combined television signal;

memory means connected to the parallel inputs and parallel outputs and having a plurality of individually addressable memory locations arranged in rows and columns, with each shift register being assigned to a respective group of memory locations; and sequence control means including a plurality of address counters connected to the memory means for independently addressing each group of memory locations.

BRIEF DESCRIPTION OF THE DRAWINGS

One example of the switching arrangement according to the present invention is shown in the drawings.

FIG. 1 is a block schematic diagram of an embodiment of the switching arrangement in accordance with the invention.

FIG. 2 is a signal flow diagram illustrating the time sequence of signals arriving at the inputs and outputs of the arrangement of FIG. 1.

FIG. 4 is a diagram showing the data organization in the memory with reference to the block diagram of FIG. 1.

DESCRIPTION OF THE PREFERRED EMBODIMENTS

Figure 3:
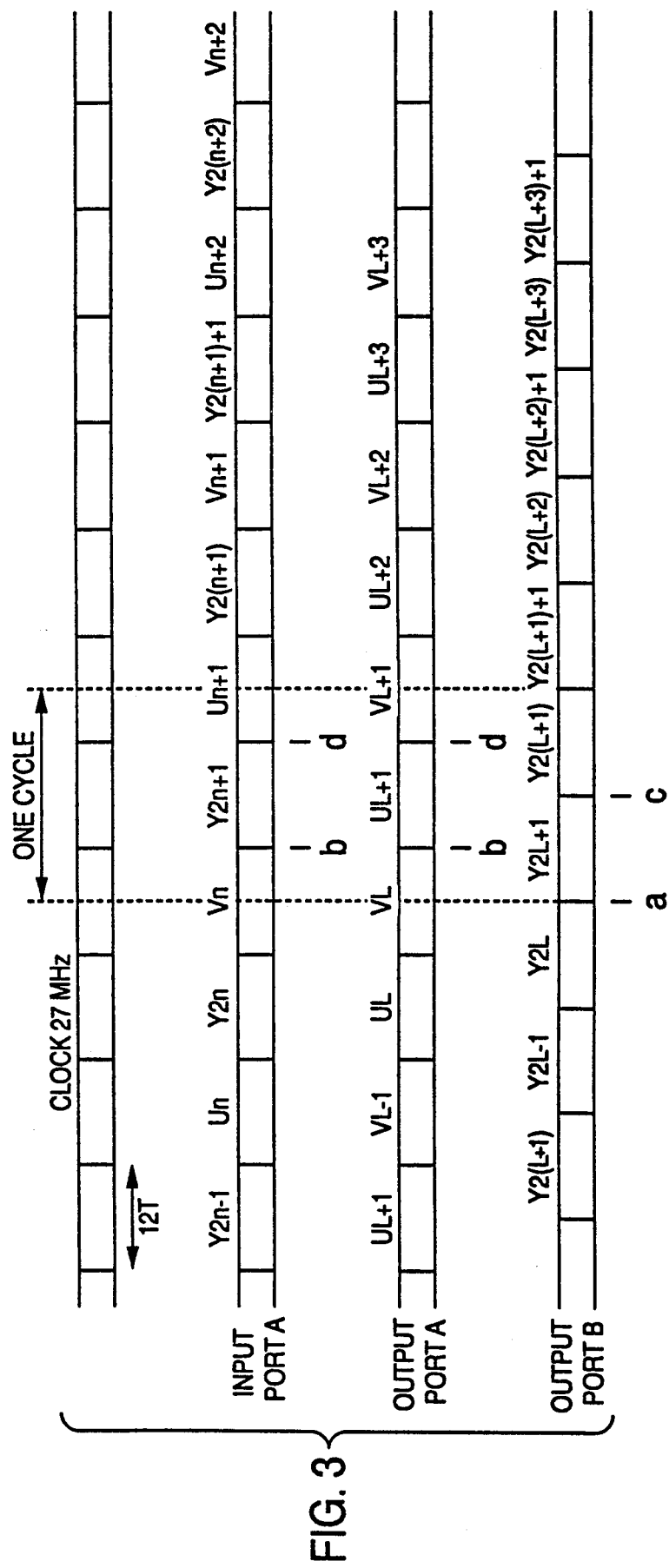
FIG. 3 is diagram illustrating the storage organization for signal representations in the memory of an arrangement according to the invention.

The system shown in FIG. 1 includes a shift register 1 and a shift register 2 which are combined to form a port A having serial input and outputs. A further shift register 3 constitutes a port B having serial outputs. Shift registers 1, 2 and 3 are connected to a memory 4 via parallel input and output busses. By means of address counters VA1 VA2 and VB for the memory location rows and address counters HA1, HA2 and HB for the memory location columns, the inputs and outputs of port A and port B can be assigned memory locations independently of one another.

Data entering via the serial inputs of port A can be written into memory 4 at locations specified by instructions from address counters VA2 and HA1. To read out the stored information, corresponding memory locations can be addressed, and their contents sent to port A by means of address counters VA2 and HA2 and a similar operation can be performed with respect to port B by address counters VB and HB. For this assignment, the stored data need only be read out once.

In order to permit read-outs with a higher frequency, the shift registers 1, 2 and 3 are organized in such a manner that during writing in, a shift register transmits blocks of a block length X to memory 4 and during reading out, blocks of a block length 2X are transmitted. It is then possible to cycle the shift registers of port A to the same clock frequency.

By way of example, a block length X may be equal to 16 or 24 bits and constitutes part of a picture line. Memory 4 may have several pairs of rows, C and Y, of memory locations depending on the number of rows to be stored during a given time interval. It is also possible to set up both shift registers for a block length of 2X but to only transmit blocks of a block length X during writing in.

With a demultiplexer set up in this manner, data streams of $13.5 \times 10^6$ scanned values per second for luminance and two times $6.75 \times 10^6$ scanned values per second for chrominance can be written in. Read out can then be effected at double this scanning rate.

The top line of FIG. 2 shows the time sequence of scanned image data values at the serial inputs of shift register 1 The scanned values assigned to a memory location row are given an associated row index of 1, 2,,3, 4, etc. Each value is stored in a different memory location and the stored values can be separated into luminance and chrominance groups upon read out via port A and port B The advantage of the separation into luminance and chrominance groups during writing in is that the correct data can be read at the correct time so that additional demultiplexers and intermediate storage are not required Only two rows, Y and C, of memory are required for each storage cycle. The first row is used for the luminance portion and the second row is used for the chrominance portion The incoming blocks YN, CN, YN +1, etc., are written consecutively on the same columns of rows Y and C. For example, blocks YN and CN are written in to the same column. The addresses for these blocks are selected by the address counter HA1 and VA1 or VA2.

To read out the blocks, the C row locations are switched to port A, which is triggered by address counters HA2 and VA1, and the Y row locations are switched to port B which is triggered by address counters HB and VB. This organization requires the use of only six address counters instead of eight, and thus, by integrating counters, shift registers and memory on a single chip, makes possible the use less chip surface.

In FIG. 3 the relation in the time sequence between writing and reading the signals is shown.

FIG. 4 shows the same block diagram as FIG. 1 with two memory location rows Y and C of memory 4 being illustrated. The luminance parts are stored in the Y row and the chrominance parts are stored in the C row. The association of the address counters with individual memory locations for which they would be triggered for selection is depicted graphically. Referring to FIG. 3, moment a, block $Y_{21+1}$ is read out of memory 4 into register 3 and block $Y_{21+2}$ is read out of memory 4 into an associated read buffer. At moment b, block $V_n$ is read out of register 1 into an associated write buffer, block $U_{1+1}$ is read out of memory 4 into port A, and block $V_{1+1}$ is read out of memory 4 into a read buffer associated with port A. At moment c, block $Y_{21+2}$ is read out of the associated read buffer into register 3. At moment d, block $U_{n+1}$ is read out of port A into an associated write buffer, block $V_n$ is read out of the associated write buffer into memory 4, and block $V_{1+1}$ is read out of the associated read buffer into port A.

The number of blocks, or samples, Y, is twice that of each of blocks U and V Therefore, each block $U_n$ and $V_n$ corresponds to blocks $Y/2_n$ and $Y_{2n+1}$.

The buffers, or latches, are memories connected between each register and memory 4 to temporarily store a group of words waiting to be transferred to memory 4 (write buffers) or a register (read buffers) This avoids interference between reading and writing operations in memory 4.

This application relates to subject matter disclosed in Federal Republic of Germany Application P 37 33 014.4, filed on Sept. 30, 1987, the disclosure of which is incorporated herein by reference.

While the description above shows particular embodiments of the present invention, it will be understood that many modifications may be made without departing from the spirit thereof. The pending claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A demultiplexer for a combined color television signal composed of a plurality of first components containing luminance information and a plurality of second components containing chrominance information, the television signal initially being in a form such that the second components alternate in time with the first components, said demultiplexer comprising:

first shift register means having a plurality of register locations, a serial input connected to receive the television signal in its initial form, parallel inputs and outputs and a serial output;

second shift register means having a plurality of register locations parallel inputs and a serial output;

memory means connected to said parallel inputs and parallel outputs and having a plurality of individually addressable memory locations arranged in rows and columns; and sequence control means including a plurality of address counters connected to said memory means so that each said counter independently addresses a selected group of memory locations, said counters including two write address counters operable for writing each component of the television signal into a respective group of memory locations from said parallel outputs of said first shift register means, and two read address counters operable for reading each first component of the television signal from said memory means to said parallel inputs of one of said shift register means and for reading each second component of the television signal from said memory means to said parallel inputs of the other one of said shift register means, whereby the first components of the television signal are supplied in succession to said serial output of said one register means and the second components of the television signal are supplied in succession to said serial output of the other one of said register means.

2. A demultiplexer as defined in claim 1 wherein said write address counters include two row address counters.

3. A demultiplexer as defined in claim 2 wherein said write address counters further include a column address counter.

4. A demultiplexer as defined in claim 2 wherein said read address counters include two row address counters.

5. A demultiplexer ad defined in claim 1 wherein said read address counters further include a column address counter.

6. A demultiplexer ad defined in claim 1 wherein one of said address counters constitutes a write address counter and a read address counter.

7. A demultiplexer as defined in claim 1 wherein each of aid first and second shift register means have an identical number of register locations.

* * * * *